United States Patent
Sugawara

Patent Number: 5,570,064
Date of Patent: Oct. 29, 1996

[54] AUTOMATIC GAIN CONTROL AMPLIFIER FOR USE IN RADIO TRANSMITTER-RECEIVER

[75] Inventor: Hideo Sugawara, Kawasaki, Japan

[73] Assignee: Fujitsu Limited, Kanagawa, Japan

[21] Appl. No.: 407,201

[22] Filed: Mar. 20, 1995

[30] Foreign Application Priority Data

Jul. 14, 1994 [JP] Japan .................................. 6-162162

[51] Int. Cl.[6] ........................................................ H03G 3/12
[52] U.S. Cl. ............................................ 330/282; 330/283
[58] Field of Search ................................ 330/86, 110, 282, 330/283, 310

[56] References Cited

U.S. PATENT DOCUMENTS 5,319,318  6/1994  Kunihisa et al. ..................... 330/282

FOREIGN PATENT DOCUMENTS

61-181210  8/1986  Japan .

*Primary Examiner*—Steven Mottola

[57] ABSTRACT

An AGC amplifier used in a radio transmitter-receiver such as an portable telephone, in which a transistor for amplification is connected in series to a transistor for buffer as in direct current, and a third transistor is connected to the transistor for amplification, or to the transistor for amplification and the transistor for buffer to vary a feed-back quantity by varying a bias at a base or gate of the third transistor so as to vary a gain, thereby preventing a saturation characteristics of the circuit current from changing even In a change of the gain of the amplifier.

15 Claims, 8 Drawing Sheets

AUTOMATIC GAIN CONTROL AMPLIFIER FOR USE IN RADIO TRANSMITTER-RECEIVER

BACKGROUND OF THE INVENTION

The present invention relates to an automatic gain control amplifier suitable for use in a radio transmitter-receiver such as, for example, a portable telephone.

In recent years, there has been a demand for a compactness, handiness, reduction in current consumption of the radio transmitter-receiver, such as a portable telephone. To meet this demand, it has been necessary to integrate a high-frequency circuit used in the portable telephone, which has been formed with individual parts.

Figure 9:
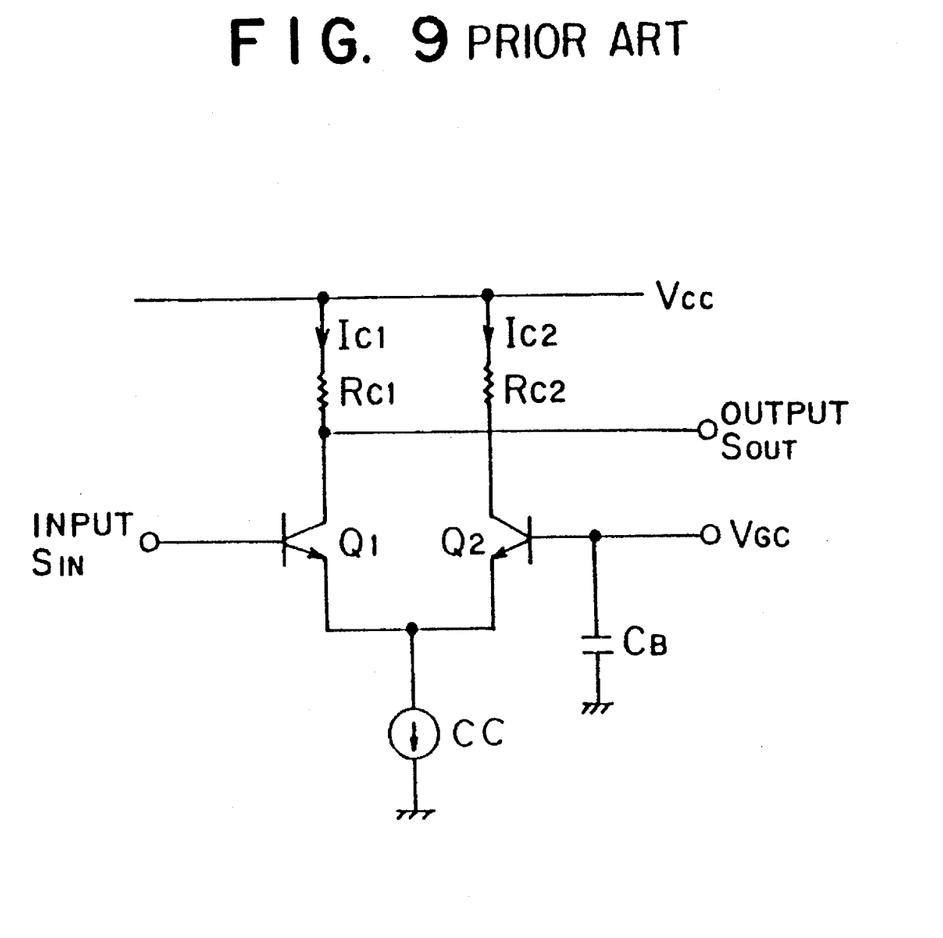
FIG. 9 is an electric circuit diagram of a typical AGC amplifier.

To realize the integration of a high-frequency circuit, there has been proposed, for example, an automatic gain control amplifier (AGC amplifier) shown in FIG. 9. In FIG. 9, transistors $Q_1$ and $Q_2$ are differentially connected to each other.

More specifically, a collector of the transistor $Q_1$ is connected to a voltage source $V_{CC}$ via a resistor $R_{C1}$, a collector of the transistor $Q_2$ is connected to the voltage source $V_{CC}$ via a resistor $R_{C2}$, and emitters of the transistors $Q_1$ and $Q_2$ are connected to a constant current source CC.

The voltage source $V_{GC}$ served to control a gain is connected to a base of the transistor $Q_2$, and a grounded capacitor $C_B$ is connected to the base of the transistor $Q_2$.

An input signal $S_{IN}$ is inputted to a base of the transistor $Q_1$ so that an amplified output $S_{OUT}$ is outputted from the side of the collector of the transistor $Q_1$. With the above arrangement, the AGC amplifier shown in FIG. 9 operates in a way that the input signal $S_{IN}$ is inputted to the base of the transistor $Q_1$, and a voltage of the voltage source $V_{GC}$ (occasionally referred as $V_{GC}$ for convenience) is varied to change a gain of the output signal $S_{OUT}$ outputted from the side of the collector of the transistor $Q_1$.

In the above AGC amplifier, a saturation power changes since a current $I_{C1}$ flowing through the transistor $Q_1$ changes during the operation. For instance, when the current $I_{C1}$ through the transistor $Q_1$ is decreased by controlling the voltage $V_{GC}$, in other words, when the gain is decreased, the saturation power is decreased.

When an output power is changed at a constant input power, for example, a distortion becomes larger when the gain is decreased. To avoid this, it is necessary to increase the current wastefully even when the gain is large, which results in a hindrance to a small current consumption.

SUMMARY OF THE INVENTION

To overcome the above problem, an object of this invention is to provide an AGC amplifier in which a circuit current is not fluctuated. In other words, a saturation power is not fluctuated even when a gain of the amplifier is varied.

In an AGC amplifier according to this invention, a transistor for amplification is connected in series to a transistor for buffer as in direct current, a third transistor is connected to said transistor for amplification, or to said transistor for amplification and said transistor for buffer to vary a feed-back quantity by varying a bias at a base or gate of said third transistor so as to vary a gain.

In the AGC amplifier according to this invention, an emitter or source of said transistor for amplification is grounded, a collector or drain of said transistor for amplification is connected via an impedance unit to an emitter or source of said transistor for buffer whose collector or drain is connected to a power source so as to connect in series said transistor for amplification and said transistor for buffer as in direct current. Further, the collector or drain of said transistor for amplification is connected to a base or gate of said transistor for buffer, an emitter or source of a third transistor is connected to a base or gate of said transistor for amplification, and a collector or drain of said third transistor is connected to the base or gate of said transistor for buffer, or to a collector or drain of said transistor for amplification to apply a bias control signal to a base or gate of said third transistor.

According to this invention, the AGC amplifier has the transistor for amplification, the transistor for buffer, the third transistor and the impedance unit Z formed with a resistor. With this structure, it is possible to vary a gain without causing fluctuations in the circuit current and further changes in the saturation characteristics so as to realize a small current consumption. This invention, therefore, provides advantages of improving the performance and reducing dimensions of, for example, a portable telephone in which the AGC amplifier of this invention is used.

DESCRIPTION OF THE PREFERRED EMBODIMENTS (a) Description of an Aspect of the Invention Now, description will be made of an aspect of this invention with reference to accompanying drawings.

Figure 1:
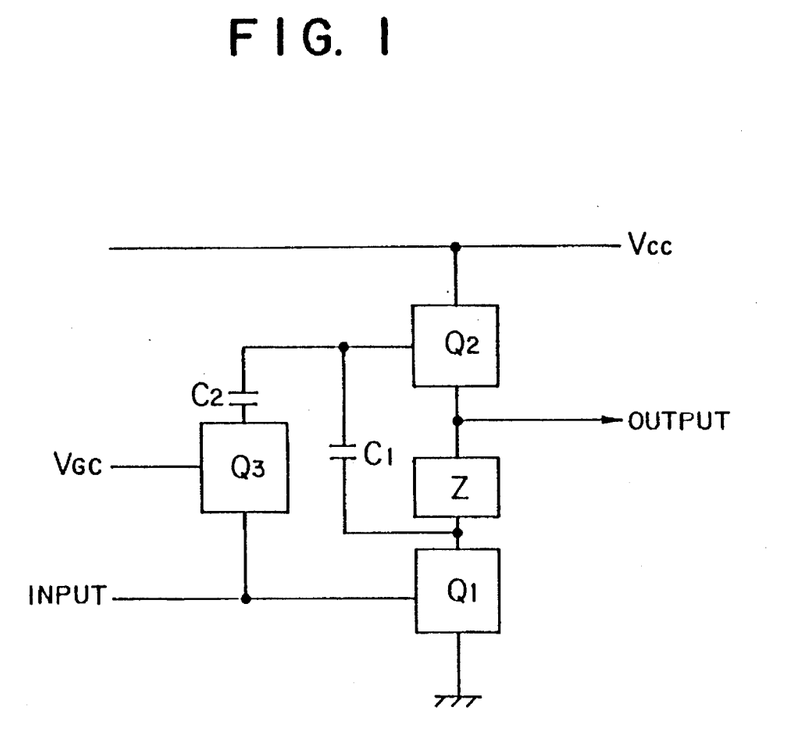
FIG. 1 is a block diagram showing an aspect of this invention.

FIG. 1 is a block diagram showing the aspect of this invention. In an AGC amplifier shown in FIG. 1, a transistor for amplification $Q_1$ and a transistor for buffer $Q_2$ are connected in series as in direct current, and a third transistor $Q_3$ is connected to the transistor $Q_1$, or to the transistors $Q_1$ and $Q_2$ to vary a feed-back quantity by varying a bias at a base or gate of the third transistor $Q_3$ so as to vary a gain.

More specifically, the emitter or source of the transistor for amplification $Q_1$ is grounded, and the collector or drain of the transistor for amplification $Q_1$ is connected via an impedance unit Z to the emitter or source of the transistor for buffer $Q_2$ whose collector or drain is connected to a power source so that the transistor for amplification and the transistor for buffer are connected in series as in direct current. Further, the collector or drain of the transistor for amplification $Q_1$ is connected to the base or gate of the transistor for buffer $Q_2$, the emitter or source of the third transistor $Q_3$ is connected to the base or gate of the transistor for amplification $Q_1$, the collector or drain of the third transistor $Q_3$ is connected to the base or gate of the transistor for buffer $Q_2$, or to the collector or drain of the transistor for amplification $Q_1$, and a bias control signal is applied to the base or gate of the third transistor $Q_3$.

The impedance unit Z connected between the collector or drain of the transistor for amplification $Q_1$ and the emitter or source of the transistor for buffer $Q_2$ may be formed with a resistor.

Further, the transistor for amplification $Q_1$ and the transistor for buffer $Q_2$ may be formed with bipolar transistors, and the impedance unit Z connected between the collector of the transistor for amplification $Q_1$ and the emitter of the transistor for buffer $Q_2$ may be formed with an inductor. Otherwise, the transistor for amplification $Q_1$ and the transistor for buffer $Q_2$ may be formed with field effect transistors, and the impedance unit Z connected between the drain of the transistor for amplification $Q_1$ and the source of the transistor for buffer $Q_2$ may be formed with a resistor and an inductor.

A capacitor $C_2$ may be connected in series to the emitter or source, or to the collector or drain of the third transistor $Q_3$.

Further, in the case where the transistor for amplification $Q_1$ and the transistor for buffer $Q_2$ are formed with bipolar transistors, the collector of the transistor for amplification $Q_1$ may be connected to the base of the transistor for buffer $Q_2$ via a capacitor $C_1$. Otherwise, in the case where the transistor for amplification $Q_1$ and the transistor for buffer $Q_2$ are formed with field effect transistors, the drain of the transistor for amplification $Q_1$ may be connected directly to the gate of the transistor for buffer $Q_2$.

Still further, in the case where the transistor for amplification $Q_1$ and the transistor for buffer $Q_2$ are formed with bipolar transistors, a bias may be supplied from a constant voltage source to the base of the transistor for amplification $Q_1$ via a resistor, and the base of the transistor for buffer $Q_2$ may be connected to the collector of the transistor for buffer $Q_2$ via a resistor, thereby forming a bias circuit for the transistor for amplification $Q_1$ and the transistor for buffer $Q_2$.

In the above-described AGC amplifier according to this invention, a bias at the base or gate of the third transistor $Q_3$ is varied to vary a feed-back quantity so as to vary a gain.

More specifically, by applying a bias control signal to the base or gate of the third transistor $Q_3$, the gain may be changed without causing fluctuations in the circuit current.

The impedance unit Z connected between the collector or drain of the transistor for amplification $Q_1$ and the emitter or source of the transistor for buffer $Q_2$ is formed with a resistor so that the gain may be varied without causing fluctuations in the circuit current.

Otherwise, in the case where the transistor for amplification $Q_1$ and the transistor for buffer $Q_2$ are formed with bipolar transistors, the impedance unit connected between the collector of the transistor for amplification $Q_1$ and the emitter of the transistor for buffer $Q_2$ may be formed with an inductor so as to provide a large direct current voltage applied to the transistors $Q_1$ and $Q_2$, and further provide a large output signal.

In the case where the transistor for amplification $Q_1$ and the transistor for buffer $Q_2$ are formed with field effect transistors, the impedance unit Z connected between the drain of the transistor for amplification $Q_1$ and the source of the transistor $Q_2$ may be formed with a resistor and an inductor so as to provide a large direct current voltage applied to the transistors $Q_1$ and $Q_2$, thereby providing a large output.

The capacitor $C_2$ is connected in series to the emitter or source, or to the collector or drain of the third transistor $Q_3$ to prevent a direct current from flowing to the third transistor $Q_3$ if the gain is set to a large value, thereby stabilizing a bias for the transistor for amplification $Q_1$.

In the case where the transistor for amplification $Q_1$ and the transistor for buffer $Q_2$ are formed with bipolar transistors, the collector of the transistor for amplification $Q_1$ is connected to the base of the transistor for buffer $Q_2$ via the capacitor $C_1$ so as to keep a potential relationship between the collector of the transistor for amplification $Q_1$ and the base of the transistor for buffer $Q_2$.

In the case where the transistor for amplification $Q_1$ and the transistor for buffer $Q_2$ are formed with field effect transistors, the drain of the transistor for amplification $Q_1$ is directly connected to the gate of the transistor for buffer $Q_2$ so as to vary the gain without causing fluctuations in the circuit current.

In the case where the transistor for amplification $Q_1$ and the transistor for buffer $Q_2$ are formed with bipolar transistors, a bias is supplied from a constant voltage source to the base of the transistor for amplification $Q_1$ via a resistor, and the base of the transistor for buffer $Q_2$ is connected to the collector of the transistor for buffer $Q_2$ via a resistor so that a bias circuit for the transistor for amplification $Q_1$ and the transistor for buffer $Q_2$ may be formed with a simple structure. This arrangement may vary the gain without causing fluctuations in the circuit current.

The AGC amplifier according to this invention has the transistor for amplification $Q_1$, the transistor for buffer $Q_2$, the third transistor $Q_3$ and the impedance unit Z formed with a resistor. With this structure, it is possible to vary the gain without causing fluctuations in the circuit current and further changes in the saturation characteristics to realize a small current consumption. It is further possible to improve the performance and to reduce dimensions of, for example, a portable telephone in which the AGC amplifier according to this invention is used.

According to this invention, the impedance unit Z connected between the collector of the transistor for amplification $Q_1$ and the emitter of the transistor for buffer $Q_2$ is an inductor so as to provide a large direct current voltage applied to the transistors $Q_1$ and $Q_2$, and to further provide a large output. This contributes to an improvement in performance of the AGC amplifier.

According to this invention, the transistors $Q_1$, $Q_2$ and $Q_3$ are not formed with bipolar transistors, but with field effect transistors, and the impedance unit connected between the collector of the transistor for amplification $Q_1$ and the emitter of the transistor for buffer $Q_2$ is formed with a resistor $R_D$ and an inductor $L_D$, thereby providing a large direct current voltage applied to the transistors $Q_1$ and $Q_2$, and a large output. This structure further makes it possible to set an output impedance freely, which contributes to improvement in the performance of the AGC amplifier.

According to this invention, the capacitor $C_2$ is connected in series to the emitter or source, or to the collector or drain of the third transistor $Q_3$, thereby preventing a direct current from flowing between the collector and emitter, or the drain and source of the third transistor $Q_3$, irrespective of a value of the gain control voltage $V_{GC}$. This structure is effective to stabilize a bias for the transistor for amplification $Q_1$, and further to allow the gain control voltage $V_{GC}$ to be set freely so as to provide a wide range gain control.

According to this invention, the collector of the transistor for amplification $Q_1$ is connected to the base of the transistor for buffer $Q_2$ via the capacitor $C_1$. This arrangement is effective to keep a potential relationship between the collector of the transistor for amplification $Q_1$ and the base of the transistor for buffer $Q_2$, improving reliability of the circuit.

According to this invention, the transistors for amplification $Q_1$ and the transistor for buffer $Q_2$ are not formed with bipolar transistors but with field effect transistors, and the drain of the transistor for amplification $Q_1$ is directly connected to the gate of the transistor for buffer $Q_2$, thereby changing the gain without causing fluctuations in the circuit current and further changes in the saturation characteristics, thus realizing a low current consumption. In addition, this arrangement makes it possible to omit the power source $V_{BB}$ served to apply a bias voltage, realizing a compact circuit and contributing to reduction in dimensions of, for example, a portable telephone using the AGC amplifier according to this invention.

According to this invention, a bias is supplied from the constant voltage source $V_{BB}$ to the base of the transistor for amplification $Q_1$ via the resistor $R_{B1}$, and the base of the transistor for buffer $Q_2$ is connected to the collector of the transistor for buffer $Q_2$ to form a bias circuit for the transistor for amplification $Q_1$ and the transistor for buffer $Q_2$. This structure may simplify the bias circuit and realize considerably low current consumption.

(b) Description of First Embodiment

Hereinafter, description will be made of embodiments of this invention with reference to the drawings.

Figure 2:
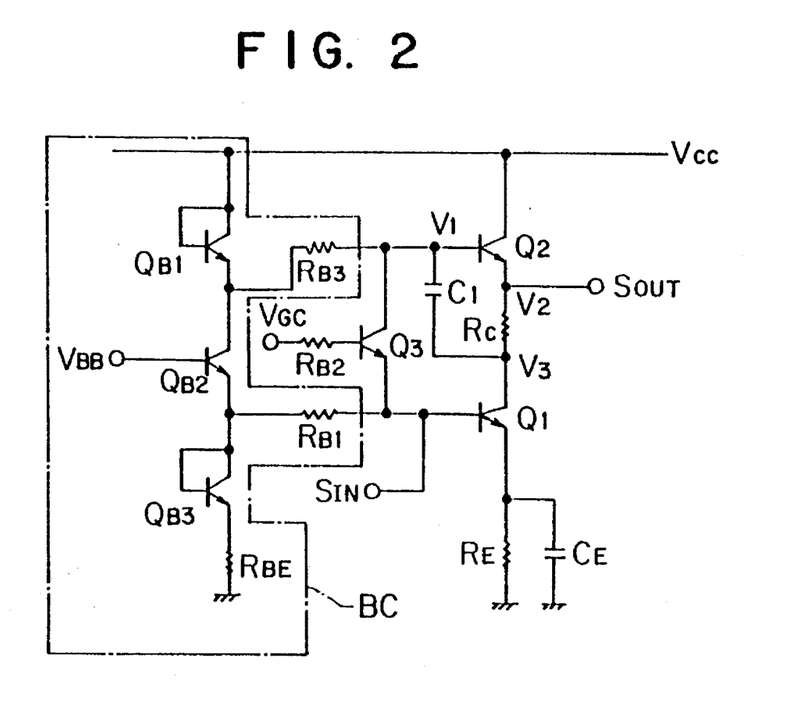
FIG. 2 is an electric circuit diagram of an AGC amplifier according to a first embodiment of this invention.

FIG. 2 is an electric circuit diagram of an AGC amplifier according to the first embodiment of this invention. The AGC amplifier shown in FIG. 2 has six transistors $Q_1$, $Q_2$, $Q_3$, $Q_{B1}$, $Q_{B2}$, $Q_{B3}$. Each of these transistors is formed with a bipolar transistor.

Next, electrical connections between the transistors will be described.

The emitter of the transistor for amplification $Q_1$ is grounded via a resistor $R_E$ and a capacitor $C_E$ which are connected in parallel to each other. The collector of the transistor for amplification $Q_1$ is connected to the emitter of the transistor for buffer $Q_2$ via a resistor $R_c$ (an impedance unit). The collector of the transistor for buffer $Q_2$ is connected to a constant voltage source $V_{CC}$. Here, the transistor for amplification $Q_1$ and the transistor for buffer $Q_2$ are connected in series as in direct current.

The collector of the transistor for amplification $Q_1$ is connected to the base of the transistor for buffer $Q_2$ via a capacitor $C_1$ (a coupling capacitor). The emitter of the third transistor $Q_3$ is connected to the base of the transistor for amplification $Q_1$. The collector of the third transistor $Q_3$ is connected to the base of the transistor for buffer $Q_2$ and the collector of the transistor for amplification $Q_1$. In the above arrangement, a bias control signal $V_{GC}$ is applied to the base of the third transistor $Q_3$ via a resistor $R_B$.

The capacitor $C_1$, is interposed between the collector of the transistor for amplification $Q_1$ and the base of the transistor for buffer $Q_2$. In addition, the resistor $R_c$ is interposed between the collector of the transistor for amplification $Q_1$ and the emitter of the transistor for buffer $Q_2$. A base potential $V_1$ of the transistor for buffer $Q_2$, an emitter potential $V_2$ of the transistor for butter $Q_2$ and a collector potential $V_3$ of the transistor for amplification $Q_1$ are, therefore, in relationship: $V_1 > V_2 > V_3$.

A bias circuit BC formed with the transistors $Q_{B1}$, $Q_{B2}$ and $Q_{B3}$, and resistors $R_{BE}$ and $R_{B1}$ applies a bias voltage to the bases of each of the transistors $Q_1$ and $Q_2$.

This bias circuit BC is configured with a line made up of the transistors $Q_{B1}$, $Q_{B2}$ and $Q_{B3}$, and the resistor $R_{BE}$, which is capable of producing a base bias for the transistors $Q_1$ and $Q_2$ from a constant voltage source $V_{BB}$.

More specifically, the bias circuit BC supplies a bias to the base of the transistor for amplification $Q_1$ from the emitter of the transistor $Q_{B2}$ via the resistor $R_{B1}$, and, at the same time, supplies a bias to the base of the transistor for buffer $Q_2$ from the emitter of the transistor $Q_1$ via a resistor $R_{B3}$.

Meanwhile, the base of the third transistor $Q_3$ is supplied with a bias voltage from the power source $V_{GC}$ for controlling a gain. The protective resistor $R_{B2}$ is inserted to protect the third transistor $Q_3$.

An input signal $S_{IN}$ is inputted to the base of the transistor $Q_1$, while an output signal $S_{OUT}$ is outputted from the side of the emitter of the transistor $Q_2$.

In the AGC amplifier according to the first embodiment of this invention, the input signal $S_{IN}$ when inputted to the base of the transistor $Q_1$, is amplified in the transistor $Q_1$ by a feed-back quantity controlling action of the transistor $Q_3$ in cooperation with the bias voltage supplied from the bias circuit BC so that the output signal $S_{OUT}$ is outputted from the side of the emitter of the transistor $Q_2$. At this time, by varying the bias voltage at the base of the third transistor $Q_3$, that is, the bias control signal $V_{GC}$, depending on, for example, intensity of the input signal $S_{IN}$, a feed-back quantity fed from the collector of the transistor $Q_1$ to the base of the same is varied, thereby varying the gain without causing fluctuations in the circuit current. The AGC amplifier according to the first embodiment of this invention has a larger current flowing through the transistors than the apparatus shown in FIG. 9 if a total current is the same, thus providing a larger saturation power.

The interposition of the capacitor $C_1$ between the collector of the transistor for amplification $Q_1$ and the base of the transistor for buffer $Q_2$ is effective to properly keep a potential relationship between the collector of the transistor for amplification $Q_1$ and the base of the transistor for buffer $Q_2$.

According to the first embodiment of this invention, the AGC amplifier has the third transistor $Q_3$ for controlling the gain, to the base of which the bias control signal $V_{GC}$ is applied, thereby varying the gain without causing fluctuations in the circuit current and realizing a small current consumption. If this AGC amplifier is used, for example, in a portable telephone, it improves the performance and decreases the size of the telephone.

The interposition of the capacitor $C_1$ is effective to keep the potential relationship between the collector of the transistor for amplification $Q_1$ and the base of the transistor for buffer $Q_2$, contributing to improvement in reliability of the circuit.

(c1) Description of Second Embodiment

Figure 3:
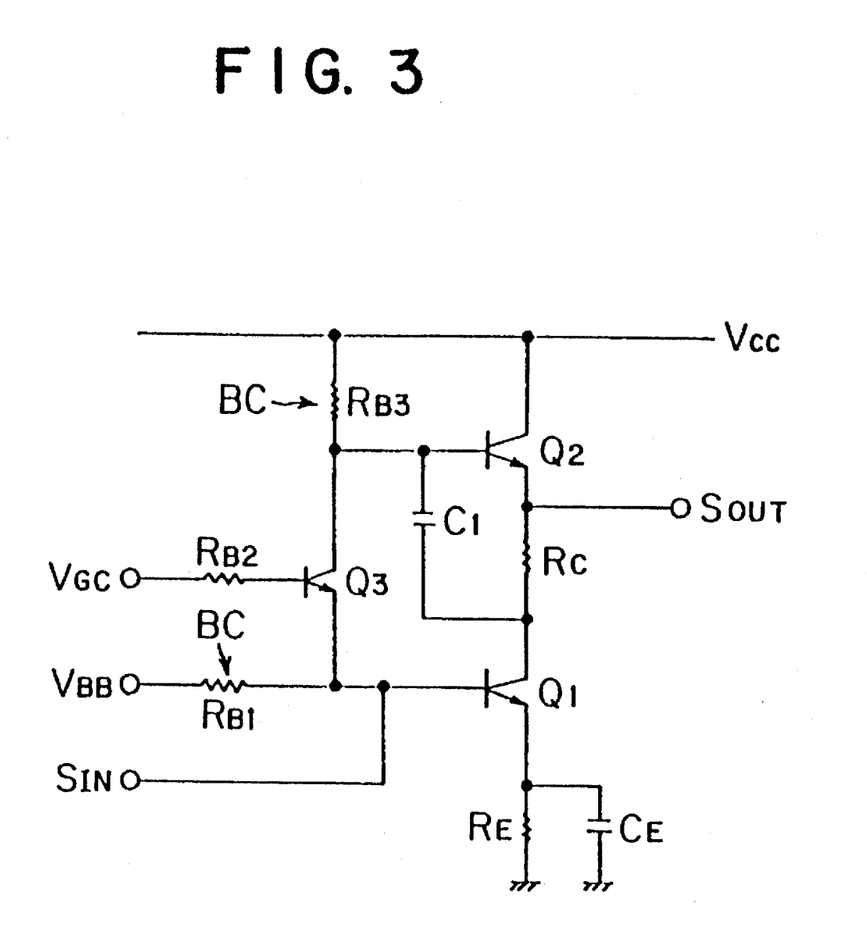
FIG. 3 is an electric circuit diagram of an AGC amplifier according to a second embodiment of this invention.

FIG. 3 is an electric circuit diagram of an AGC amplifier according to a second embodiment of this invention. The AGC amplifier shown in FIG. 3 has a simpler bias circuit BC than the AGC amplifier shown in FIG. 2.

More specifically, a bias circuit for the transistor for amplification $Q_1$ and the transistor for buffer $Q_2$ is formed by supplying a bias voltage from a constant voltage source $V_{BB}$ to the base of the transistor for amplification $Q_2$ via resistor $R_{B1}$, and by connecting the base of the transistor for buffer $Q_2$ to the collector of the transistor for buffer $Q_2$ via resistor $R_{B3}$. This structure may omit a part of the circuit formed with the transistors $Q_{B1}$, $Q_{B2}$ and $Q_{B3}$ and the resistor $R_{BE}$ shown in FIG. 2, simplifying the structure of the bias circuit.

The third transistor $Q_3$ is formed with a bipolar transistor, same as in the above-described first embodiment. The collector of the third transistor $Q_3$ is connected to the base of the transistor for buffer $Q_2$, to the collector of the transistor for buffer $Q_2$ via the resistor $R_{B3}$, and, at the same time, to the collector of the transistor for amplification $Q_1$ via a capacitor $C_1$.

The transistor for amplification $Q_1$, the transistor for buffer $Q_2$, resistor $R_C$, capacitor $C_1$, resistor $R_E$ and capacitor $C_E$ are connected to each other in the same manner as in the above-described first embodiment. The input signal $S_{IN}$ and the output signal $S_{OUT}$ are in the same relationship as in the above-described first embodiment.

In the AGC amplifier according to the second embodiment, the input signal $S_{IN}$ when inputted to the base of the transistor $Q_1$, is amplified in the transistor $Q_1$ by a feed-back quantity controlling action of the transistor $Q_3$ in cooperation with the bias voltage supplied from the bias circuit BC so that the output signal $S_{OUT}$ is outputted from the side of the emitter of the transistor $Q_2$, same as in the above-described first embodiment. A feed-back quantity fed from the collector of the transistor for amplification $Q_1$ to the base of the same may be varied by varying the bias voltage at the base of the third transistor $Q_3$, that is, the bias control signal $V_{GC}$, depending on, for example, intensity of the input signal $S_{IN}$, thereby varying the gain without causing fluctuations in the circuit current.

The capacitor $C_1$ is interposed between the collector of the transistor for amplification $Q_1$ and the base of the transistor for buffer $Q_2$ to properly keep a potential relationship between the collector of the transistor for amplification $Q_1$ and the base of the transistor for buffer $Q_2$, same as in the first embodiment.

The AGC amplifier according to the second embodiment has the third transistor $Q_3$ for controlling the gain, to the base of which the bias control signal $V_{GC}$ is applied, thereby varying the gain without causing fluctuations in the current circuit, same as in the above-described first embodiment. With use of the simple circuit in which the part formed with the transistors $Q_{B1}$, $Q_{B2}$ and $Q_{B3}$ and the resistor $R_{BE}$, which is necessary in the AGC amplifier according to the first embodiment, is omitted, it is possible to realize a considerably small current consumption since the current that flows in the line formed with the transistors $Q_{B1}$, $Q_{B2}$ and $Q_{B3}$, and the resistor $R_{BE}$ as in the AGC amplifier according to the first embodiment is unnecessary.

(c2) Description of Modification of the Second Embodiment

Figure 4:
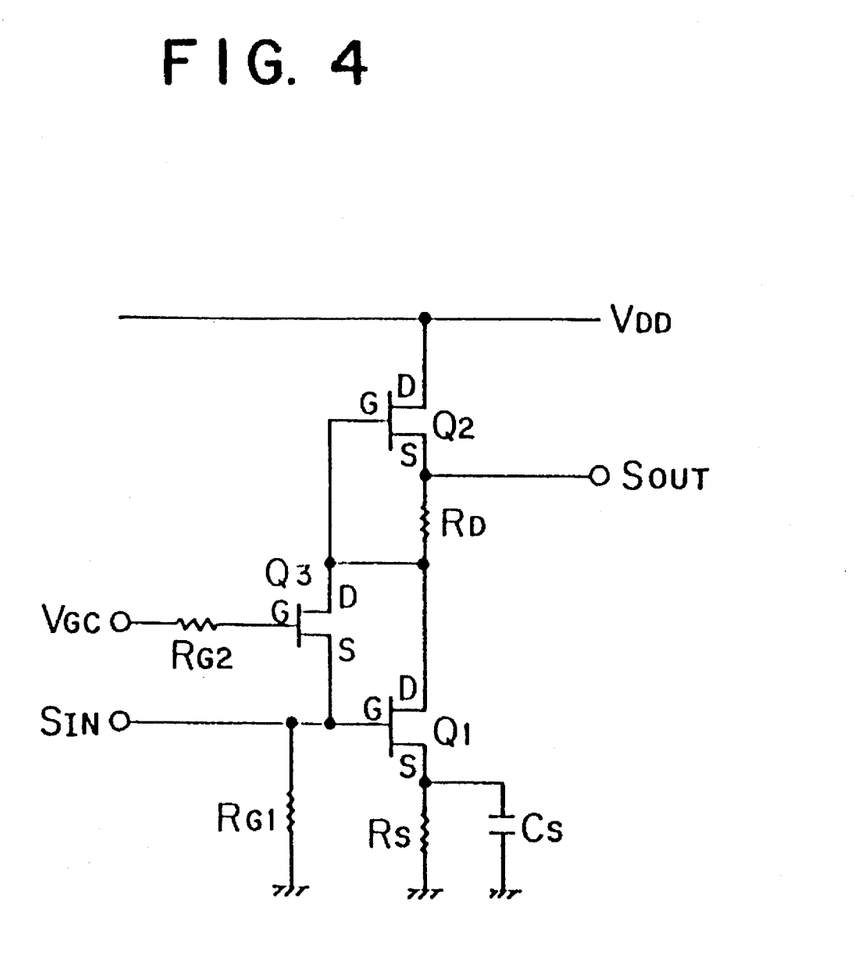
FIG. 4 is an electric circuit diagram of a modified AGC amplifier according to the second embodiment.

FIG. 4 is an electric circuit diagram of an AGC amplifier according to a modification of the second embodiment of this invention. The AGC amplifier shown in FIG. 4 is provided with transistors $Q_1$, $Q_2$ and $Q_3$ which are formed not with bipolar transistors as in the second embodiment (refer to FIG. 3), but with field effect transistors (FETs).

By employing the field effect transistors for the transistors $Q_1$, $Q_2$ and $Q_3$ in the AGC amplifier shown In FIG. 3 the capacitor $C_1$ used to keep a potential relationship among the transistors $Q_1$, $Q_2$ and $Q_3$, may be omitted enabling the drain of the transistor for amplification $Q_1$ to be directly connected to the gate of the transistor for buffer $Q_2$. It is further possible to omit the power source $V_{BB}$ served to apply a bias voltage to the transistors $Q_1$ and $Q_2$.

A bipolar transistor cannot operate without being applied with a positive voltage to its base. In the case of an FET, it is possible to form a self bias circuit which can operate by bringing the gate to a negative state with respect to the source. As a result, it is possible to omit capacitor $C_1$.

The AGC amplifier shown in FIG. 4 includes resistors $R_{G1}$, $R_{G2}$, $R_S$ and $R_D$, and capacitor $C_S$ having the similar functions to those of the resistors $R_{B1}$, $R_{B2}$, $R_C$ and $R_E$, and capacitor $C_E$, respectively, in the AGC amplifier shown in FIG. 3. In the AGC amplifier shown in FIG. 4, the input signal $S_{IN}$ and the output signal $S_{OUT}$ are in the same relationship as in the above-described first and second embodiments.

In the AGC amplifier according to the modification of the second embodiment of this invention, the input signal $S_{IN}$ when inputted to the gate of the transistor $Q_1$, is amplified in the transistor $Q_1$ by a feedback quantity controlling action of the transistor $Q_3$ in cooperation with a bias voltage fed from the bias circuit BC so that the output signal $S_{OUT}$ is outputted from the side of the source of the transistor $Q_2$. A feed-back quantity fed to the gate of the transistor $Q_1$ from the drain of the same may be varied by varying a bias voltage at the gate of the third transistor $Q_3$, that is, a bias control signal $V_{GC}$, depending on, for example, intensity of the input signal $S_{IN}$, thereby varying the gain without causing fluctuations in the circuit current.

In the AGC amplifier according to the modification of the second embodiment where the transistors $Q_1$, $Q_2$ and $Q_3$ are formed not with bipolar transistors, but with field effect transistors, it is possible to vary the gain without causing fluctuations in the circuit current and to realize a small current consumption, same as in the AGC amplifier according to the second embodiment of this invention. It is also possible to omit the power source $V_{BB}$ served to apply a bias voltage. This can reduce dimensions of the circuit and further the apparatus.

(d1) Description of Third Embodiment

Figure 5:
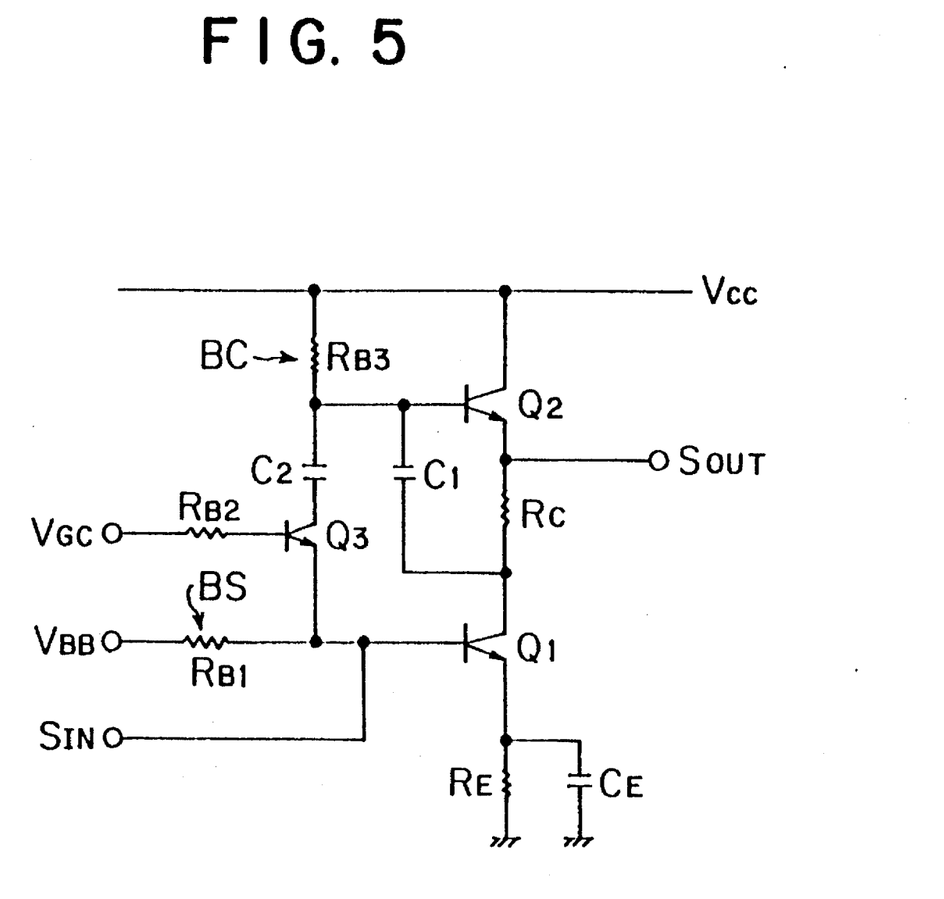
FIG. 5 is an electric circuit diagram of an AGC amplifier according to a third embodiment of this invention.

FIG. 5 is an electric circuit diagram of an AGC amplifier according to the third embodiment of this invention. In FIG. 5, there is shown a capacitor $C_2$ additionally provided to the AGC amplifier according to the second embodiment (refer to FIG. 3), which is connected in series to the collector of transistor $Q_3$ to cut direct current components. In FIG. 5, like reference characters designate like or corresponding parts of FIG. 3.

According to the third embodiment of this invention, the capacitor $C_2$ connected in series to the collector of the third transistor $Q_3$ is additionally provided in the AGC amplifier so as to prevent a direct current from flowing between the collector of the third transistor $Q_3$ and the emitter of the same if a value of the gain control voltage $V_{GC}$ becomes large.

According to the third embodiment, similarly to the first and second embodiments, the input signal $S_{IN}$ when inputted to the base of transistor $Q_1$, is amplified in the transistor $Q_1$ by a feed-back quantity controlling action of the transistor $Q_3$ in cooperation with the bias voltage fed from the bias circuit BC so that an output signal $S_{OUT}$ is outputted from the side of the emitter of transistor $Q_2$. A feed-back quantity fed from the collector of the transistor for amplification $Q_1$ to the base of the same may be varied by varying a bias voltage at the base of the third transistor $Q_3$, that is, the bias control signal $V_{GC}$, depending on, for example, intensity of the input signal $S_{IN}$, thereby varying the gain without causing fluctuations in the circuit current.

The capacitor $C_1$ is interposed between the collector of the transistor for amplification $Q_1$ and the base of the transistor for buffer $Q_2$ to properly keep a potential relationship between the collector of the transistor for amplification $Q_1$ and the base of the transistor for buffer $Q_2$.

As in the second embodiment, a bias voltage is supplied from the constant voltage source $V_{BB}$ to the base of the transistor for amplification $Q_1$ via resistor $R_{B1}$, while the base of the transistor for buffer $Q_2$ is connected to the collector of the transistor for buffer $Q_2$ via resistor $R_{B3}$ so as to form a bias circuit for the transistor for amplification $Q_1$ and the transistor for buffer $Q_2$. This structure may omit a part in the circuit formed with the transistors $Q_{B1}$, $Q_{B2}$, and $Q_{B3}$, and the resistor $R_{EE}$ of the AGC amplifier shown in FIG. 2, simplifying the structure of the bias circuit.

The AGC amplifier according to the third embodiment has the third transistor $Q_3$ and the simplified bias circuit, thereby varying the gain without causing fluctuations in the circuit current and realizing a considerable small current consumption. The additionally provided capacitor $C_2$ connected in series to the collector of the third transistor $Q_3$ is effective to prevent a direct current from flowing between the collector of the third transistor $Q_3$ and the emitter of the same, irrespective of a value of the gain control voltage $V_{GC}$, so as to stabilize a bias for the transistor for amplification $Q_1$. As a result, it is possible to set a large gain control voltage $V_{GC}$ to a large value, which provides a wide range gain control.

In the AGC amplifier according to the third embodiment, the additionally provided capacitor $C_2$ is connected in series to the collector of the transistor $Q_3$. However, the present invention is not limited to this example. The capacitor $C_2$ may be connected in series to the emitter of the transistor $Q_3$, or connected in series to both the collector of the transistor $Q_3$ and the emitter of the same. These arrangements may also bring the same effects and advantages.

(d2) Description of Modification of the Third Embodiment

Figure 6:
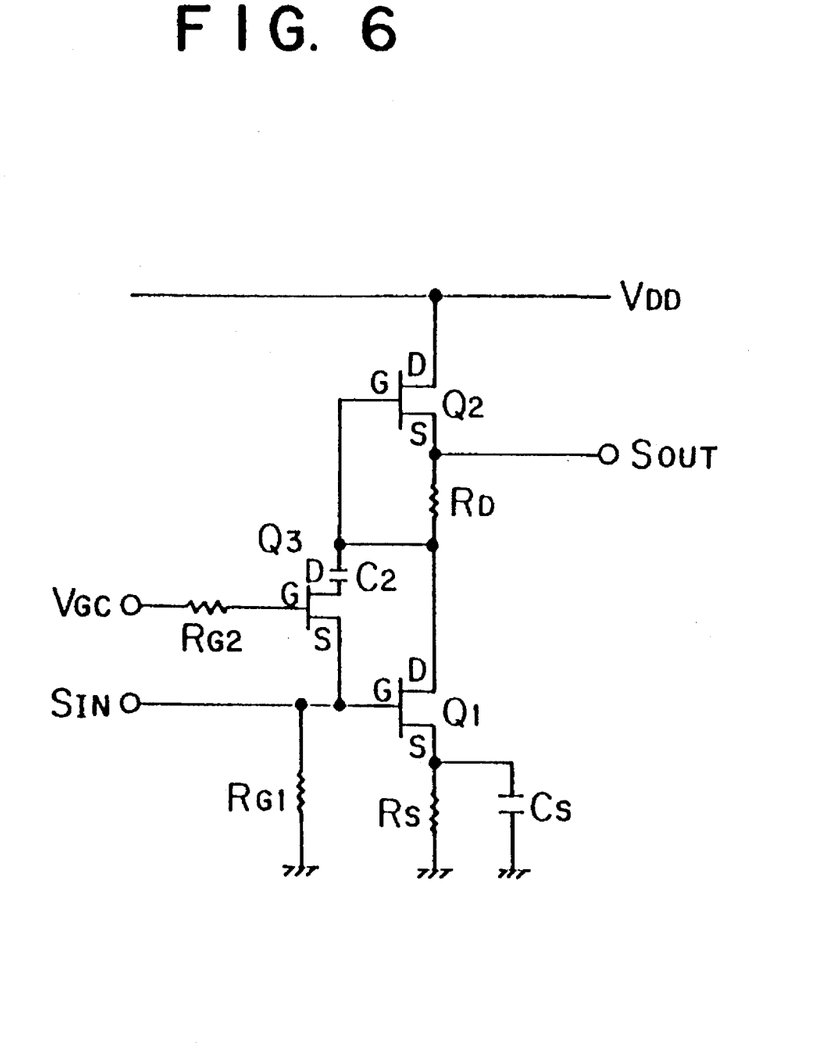
FIG. 6 is an electric circuit diagram of a modified AGC amplifier according to the third embodiment.

FIG. 6 is an electric circuit diagram of the AGC amplifier according to a modification of the third embodiment of this invention. The AGC amplifier shown in FIG. 6 has transistors $Q_1$, $Q_2$ and $Q_3$ formed not with bipolar transistors as in the third embodiment (refer to FIG. 5), but with field effect transistors (FETs).

When compared with the AGC amplifier according to the modification of the second embodiment (refer to FIG. 4), the AGC amplifier shown in FIG. 6 is additionally provided with capacitor $C_2$ connected in series to the drain of transistor $Q_3$ to cut direct current components. In FIG. 6, like reference characters designate like or corresponding parts of the circuit of FIG. 4.

With the field effect transistors for the transistors $Q_1$, $Q_2$ and $Q_3$ in the AGC amplifier shown in FIG. 5 the capacitor $C_1$ served to maintain the potential relationship among the transistors $Q_1$, $Q_2$ and $Q_3$ can be omitted, the drain of the transistor for amplification $Q_1$ can be directly connected to the gate of the transistor for buffer $Q_2$, and the source voltage $V_{BB}$ served to apply a bias voltage to the transistors $Q_1$ and $Q_2$ can be omitted, same as in the example according to the modification of the second embodiment (refer to FIG. 4).

The additionally provided capacitor $C_2$ connected in series to the drain of the third transistor $Q_3$ in the AGC amplifier according to the modification of the third embodiment of this invention may prevent a direct current from flowing between the drain of the third transistor $Q_3$ and the source of the same if a value of a gain control voltage $V_{GC}$ changes largely.

When inputted to the gate of the transistor $Q_1$, the input signal $S_{IN}$ is amplified in the transistor $Q_1$ by a feed-back quantity controlling action of the transistor $Q_3$ so that the output signal $S_{OUT}$ is outputted from the side of the source of the transistor $Q_2$. A feed-back quantity fed from the drain of the transistor $Q_1$ to the gate of the same may be varied by varying a bias voltage at the gate of the third transistor $Q_3$, that is, the bias control signal $V_{GC}$ depending on, for example, intensity of the input signal $S_{IN}$, thereby varying the gain without causing fluctuations in the circuit current.

According to the modification of the third embodiment of this invention, employment of field effect transistors, in place of bipolar transistors, for the transistors $Q_1$, $Q_2$ and $Q_3$ in the AGC amplifier may provide advantages, in addition to the advantages of the modification of the second embodiment of this invention. The additionally provided capacitor $C_2$ connected in series to the drain of the third transistor $Q_3$ may prevent a direct current from flowing between the drain of the third transistor $Q_3$ and the source of the same to stabilize a bias for the transistor for amplification $Q_1$. As a result, it is possible to set a large gain control voltage $V_{GC}$ to a large value, which provides a wide range gain control.

In the above described modified example of the third embodiment, the capacitor $C_2$ is connected in series to the drain of the transistor $Q_3$. However, this invention is not limited to the above example. It will be understood that it is possible to connect the capacitor $C_2$ to the source of the transistor $Q_3$ in series.

(e1) Description of Fourth Embodiment

Figure 7:
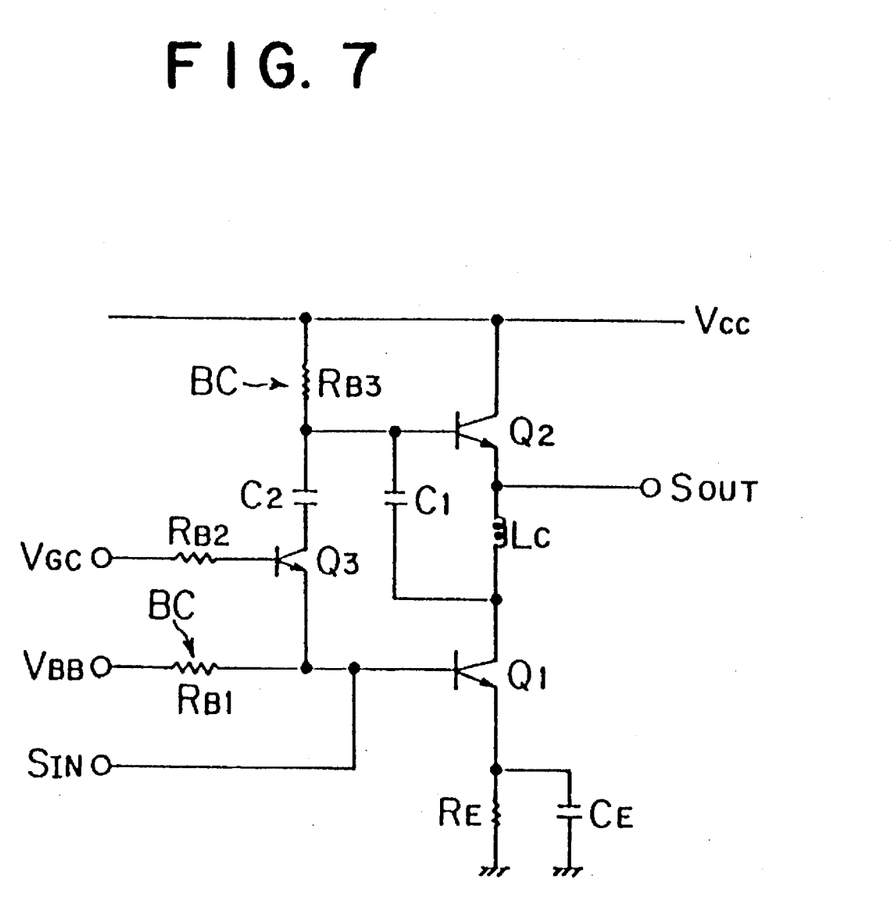
FIG. 7 is an electric circuit diagram of an AGC amplifier according to a fourth embodiment of this invention.

FIG. 7 is an electric circuit diagram of an AGC amplifier according to the fourth embodiment of this invention. In the AGC amplifier shown in FIG. 7, the impedance unit connected between the collector of the transistor for amplification $Q_1$ and the emitter of the transistor for buffer $Q_2$ is formed with an inductor $L_C$, differently from the AGC amplifier according to the third embodiment (refer to FIG. 5). In FIG. 7, like reference characters designate like or corresponding parts of the circuit shown in FIG. 5.

In the AGC amplifier according to the fourth embodiment, the impedance unit connected between the collector of the transistor for amplification $Q_1$ and the emitter of the transistor for buffer $Q_2$ is formed with inductor $L_C$ having a small impedance to a direct current, thereby providing a large direct current applied to the transistors $Q_1$ and $Q_2$, and a large output.

In the AGC amplifier according to this embodiment, the input signal $S_{IN}$ when inputted to a base of the transistor $Q_1$, is amplified in the transistor $Q_1$ by a feed-back quantity controlling action of transistor $Q_3$ in cooperation with a bias voltage fed from the bias circuit BC so that the output signal $S_{OUT}$ is outputted from the side of the emitter of the transistor $Q_2$. A feed-back quantity fed from the collector of the transistor for amplification $Q_1$ to the base of the same may be varied by varying a bias voltage at the base of the third transistor $Q_3$, that is, the bias control signal $V_{GC}$, depending on, for example, intensity of the input signal $S_{IN}$, thereby varying the gain without causing fluctuations in the circuit current.

Capacitor $C_1$ is interposed between the collector of the transistor for amplification $Q_1$ and the base of the transistor for buffer $Q_2$ so as to properly maintain a potential relationship between the collector of the transistor for amplification $Q_1$ and the base of the transistor for buffer $Q_2$. In addition, capacitor $C_2$ is connected in series to the collector of the third transistor $Q_3$ so as to prevent direct current from flowing between the collector of the third transistor $Q_3$ and the emitter of the same if a value of the gain control voltage $V_{GC}$ becomes large.

Same as in the second embodiment, a bias is supplied from the constant voltage source $V_{BB}$ to the base of the transistor for amplification $Q_1$, via resistor $R_{B1}$, while the base of the transistor for buffer $Q_2$ is connected to the collector of the transistor for buffer $Q_2$ via resistor $R_{B3}$ to form a bias circuit for the transistor for amplification $Q_1$ and the transistor for buffer $Q_2$. This structure may omit the part of the circuit formed with the transistors $Q_{B1}$, $Q_{B2}$ and $Q_{B3}$, and the resistor $R_{BE}$ shown in FIG. 2, simplifying the structure of the bias circuit.

The AGC amplifier according to the fourth embodiment has the same effects and advantages as those of the first to third embodiments. In addition, since the impedance unit connected between the collector of the transistor for amplification $Q_1$ and the emitter of the transistor for buffer $Q_2$ is formed with inductor $L_C$, it is possible to increase a direct current applied to the transistors $Q_1$ and $Q_2$ so as to provide a large output and to improve the performance of the AGC amplifier.

In the fourth embodiment, capacitor $C_2$ is connected in series to the collector of the transistor $Q_3$. However, this invention is not limited to the above example. It will be understood that capacitor $C_2$ connected to the emitter of the transistor $Q_3$ in series may provide the same effects and advantages.

(e2) Description of Modification of the Fourth Embodiment

Figure 8:
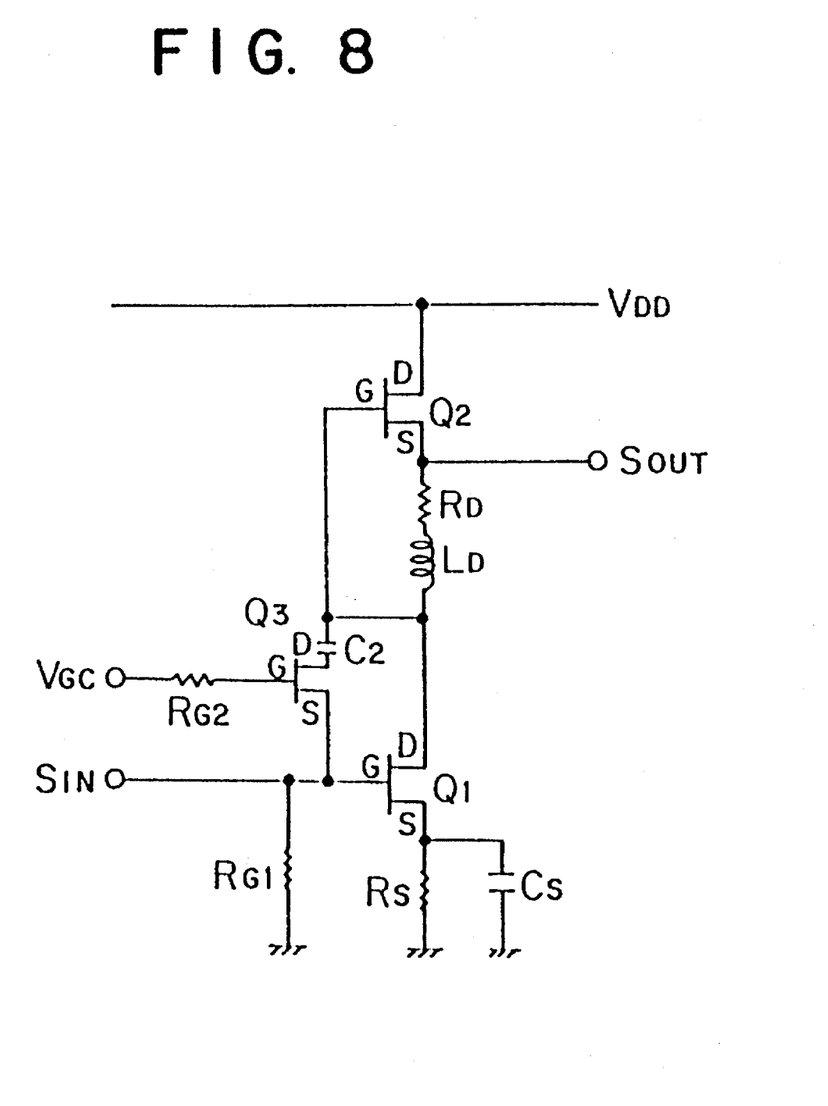
FIG. 8 is an electric circuit diagram of a modified AGC amplifier according to the fourth embodiment.

FIG. 8 is an electric circuit diagram of an AGC amplifier according to a modification of the fourth embodiment of this invention. In the AGC amplifier shown in FIG. 8, transistors $Q_1$, $Q_2$ and $Q_3$ are formed with field effect transistors (FETs), instead of the bipolar transistors as in the above-described fourth embodiment (refer to FIG. 7).

In the AGC amplifier shown in FIG. 8, the impedance unit connected between the drain of the transistor for amplification $Q_1$ and the source of the transistor for buffer $Q_2$ is formed with a series connection of resistor $R_D$ and inductor $L_D$, differently from the above-mentioned modification of the third embodiment (refer to FIG. 6). In FIG. 8, like reference characters designate like or corresponding parts of the circuit shown in FIG. 6.

In the AGC amplifier according to the modification of the fourth embodiment of this invention, the impedance unit connected between the drain of the transistor for amplification $Q_1$ and the source of the transistor for buffer $Q_2$ is formed with resistor $R_D$ and inductor $L_D$, thereby increasing a direct current applied to the transistors $Q_1$ and $Q_2$ to provide a large output. In addition, it is possible to set freely an output impedance.

If FETs are employed in the transistors $Q_1$, $Q_2$ and $Q_3$, a resistance value of resistor $R_D$ is unambiguously determined by a direct current bias value. The output impedance may, therefore, be adjusted by inserting inductor $L_D$ in series with resistor $R_D$.

In this case, the input signal $S_{IN}$ when inputted to a gate of the transistor $Q_1$, is amplified in the transistor $Q_1$ by a feed-back quantity controlling action of the transistor $Q_3$ so that the output signal $S_{OUT}$ is outputted from the side of the source of the transistor $Q_2$.

A feed-back quantity fed from the drain of the transistor for amplification $Q_1$ to the gate of the same may be varied by varying a bias voltage at the gate of the third transistor $Q_3$, that is, the bias control signal $V_{GC}$, depending on, for example, intensity of the input signal $S_{IN}$, thereby varying the gain without causing fluctuations in the circuit current.

In the AGC amplifier according to the modification of the fourth embodiment of this invention, the transistors $Q_1$, $Q_2$ and $Q_3$ are formed not with bipolar transistors, but with field effect transistors. The impedance unit connected between the drain of the transistor for amplification $Q_1$ and the source of the transistor for buffer $Q_2$ is formed with resistor $R_D$ and inductor $L_D$. This structure may provide advantages, in addition to the advantages provided by the above-described modifications of the second and third embodiments, of increasing a direct current applied to the transistors $Q_1$ and $Q_2$, setting the output impedance freely, and improving the performance of the AGC amplifier.

In the modification of the fourth embodiment, the additionally provided capacitor $C_2$ is connected to the drain of the transistor $Q_3$ in series. However, this invention is not limited to the above example. It will be understood that the capacitor $C_2$ may be connected to the source of the transistor $Q_3$ in series.

(f) Further modifications

In the above-described embodiments, the collector of the third transistor $Q_3$ is connected to the base of the transistor for buffer $Q_2$ and the collector of the transistor for amplification $Q_1$. However, this invention is not limited to the above example. If the collector of the third transistor $Q_3$ is connected to either the base of the transistor for buffer $Q_2$ or the collector of the transistor for amplifier $Q_1$, the same effects and advantages will be provided.

What is claimed is:

1. In an AGC amplifier comprising a transistor for amplification and a transistor for buffer, the improvement comprising:

an emitter of said transistor for amplification, which receives an input signal from a base thereof being grounded, and a collector of said transistor for amplification being connected via an impedance unit to an emitter of said transistor for buffer whose collector is connected to a power source to connected said transistor for amplification to said transistor for buffer in series as in direct current;

said collector of said transistor for amplification being connected to a base of said transistor for buffer; and a third transistor;

an emitter of said third transistor being connected to a base of said transistor for amplification, and a collector of said third transistor being connected to one of the base of said transistor for buffer and the collector of said transistor for amplification, and a bias control signal being applied to a base of said third transistor, an output signal being outputted from the emitter of said transistor for buffer.

2. In an AGC amplifier comprising a transistor for amplification and a transistor for buffer, the improvement comprising:

an emitter of said transistor for amplification, which receives an input signal from a base thereof being grounded, and a collector of said transistor for amplification being connected via an impedance unit to an emitter of said transistor for buffer whose collector is connected to a power source to connect said transistor for amplification to said transistor for buffer in series as in direct current;

said collector of said transistor for amplification being connected to a base of said transistor for buffer; and a third transistor;

an emitter of said third transistor being connected to a base of said transistor for amplification, and a collector of said third transistor being connected to one of the base of said transistor for buffer and the collector of said transistor for amplification, and a bias control signal being applied to a base of said third transistor, an output signal being outputted from the emitter of said transistor for buffer, wherein said impedance unit connected between the collector of said transistor for amplification and the emitter of said transistor for buffer is a resistor.

3. In an AGC amplifier comprising a transistor for amplification and a transistor for buffer, improvement comprising:

an emitter of said transistor for amplification, which receives an input signal from a base thereof being grounded, and a collector of said transistor for amplification being connected via an impedance unit to an emitter of said transistor for buffer whose collector is connected to a power source to connect said transistor for amplification to said transistor for buffer in series as in direct current;

said collector of said transistor for amplification being connected to a base of said transistor for buffer; and a third transistor;

an emitter of said third transistor being connected to a base of said transistor for amplification, and a collector of said third transistor being connected to one of the base of said transistor for buffer and the collector of said transistor for amplification, and a bias control signal being applied to a base of said third transistor, an output signal being outputted from the emitter of said transistor for buffer, wherein said transistor for amplification and said transistor for buffer are formed with bipolar transistors;

and said impedance unit connected between the collector of said transistor for amplification and the emitter of said transistor for buffer is an inductor.

4. In an AGC amplifier comprising a transistor for amplification and a transistor for buffer, the improvement comprising:

a source of said transistor for amplification, which receives an input signal from a gate thereof being grounded, and a drain of said transistor for amplification being connected via an impedance unit to a source of said transistor for buffer whose drain is connected to a power source to connect said transistor for amplification to said transistor for buffer in series as in direct current;

said drain of said transistor for amplification being connected to a gate of said transistor for buffer; and a third transistor;

a source of said third transistor being connected to a gate of said transistor for amplification, and a drain of said third transistor being connected to one of the gate of said transistor for buffer and the drain of said transistor for amplification, and a bias control signal being applied to a gate of said third transistor, an output signal being outputted from the source of said transistor for buffer, wherein said transistor for amplification and said transistor for buffer are formed with field effect transistors;

and said impedance unit connected between the drain of said transistor for amplification and the source of said transistor for buffer is formed with a resistor and an inductor.

5. In an AGC amplifier comprising a transistor for amplification and a transistor for buffer, the improvement comprising:

am emitter of said transistor for amplification, which receives an input signal from a base thereof being grounded, and a collector of said transistor for amplification being connected via an impedance unit to an emitter of said transistor for buffer whose collector is connected to a power source to connect said transistor for amplification to said transistor for buffer in series as in direct current;

said collector of said transistor for amplification being connected to a base of said transistor for buffer;

a third transistor;

an emitter of said third transistor being connected to a base of said transistor for amplification, and a collector of said third transistor being connected to one of the base of said transistor for buffer and the collector of said transistor for amplification, and a bias control signal being applied to a base of said third transistor, an output signal being outputted from the emitter of said transistor for buffer; and a capacitor connected in series to one of the emitter and the collector of said third transistor.

6. In an AGC amplifier comprising a transistor for amplification and a transistor for buffer, the improvement comprising:

an emitter of said transistor for amplification, which receives an input signal from a base thereof being grounded, and a collector of said transistor for amplification being connected via an impedance unit to an emitter of said transistor for buffer whose collector is connected to a power source to connect said transistor for amplification to said transistor for buffer in series as in direct current;

said collector of said transistor for amplification being connected to a base of said transistor for buffer; and a third transistor;

an emitter of said third transistor being connected to a base of said transistor for amplification, and a collector of said third transistor being connected to one of the base of said transistor for buffer and the collector of said transistor for amplification, and a bias control signal being applied to a base of said third transistor, an output signal being outputted from the emitter of said transistor for buffer;

wherein said transistor for amplification and said transistor for buffer are formed with bipolar transistors;

and the collector of said transistor for amplification is connected to the base of said transistor for buffer via a capacitor.

7. In an AGC amplifier comprising a transistor for amplification and a transistor for buffer, the improvement comprising:

an emitter of said transistor for amplification, which receives an input signal from a base thereof being grounded, and a collector of said transistor for amplification being connected via an impedance unit to an emitter of said transistor for buffer whose collector is connected to a power source to connect said transistor for amplification to said transistor for buffer in series as in direct current;

said collector of said transistor for amplification being connected to a base of said transistor for buffer; and a third transistor;

an emitter of said third transistor being connected to a base of said transistor for amplification, and a collector of said third transistor being connected to one of the base of said transistor for buffer and the collector of said transistor for amplification, and a bias control signal being applied to a base of said third transistor, an output signal being outputted from the emitter of said transistor for buffer;

wherein said transistor for amplification and said transistor for buffer are formed with bipolar transistors;

and a bias is supplied from a constant voltage source to the base of said transistor for amplification via a resistor, and the base of said transistor for buffer is connected to the collector of said transistor for buffer via a resistor to form a bias circuit for said transistor for amplification and said transistor for buffer.

8. In an AGC amplifier defined in claim 2, wherein said transistor for amplification and said transistor for buffer are formed with bipolar transistors;

and a bias is supplied from a constant voltage source to the base of said transistor for amplification via a resistor, and the base of said transistor for buffer is connected to the collector of said transistor for buffer via a resistor to form a bias circuit for said transistor for amplification and said transistor for buffer.

9. In an AGC amplifier defined in claim 3, wherein said transistor for amplification and said transistor for buffer are formed with bipolar transistors;

and a bias is supplied from a constant voltage source to the base of said transistor for amplification via a resistor, and the base of said transistor for buffer is connected to the collector of said transistor for buffer via a resistor to form a bias circuit for said transistor for amplification and said transistor for buffer.

10. In an AGC amplifier defined in claim 5, wherein said transistor for amplification and said transistor for buffer are formed with bipolar transistors;

and a bias is supplied from a constant voltage source to the base of said transistor for amplification via a resistor, and the base of said transistor for buffer is connected to the collector of said transistor for buffer via a resistor to form a bias circuit for said transistor for amplification and said transistor for buffer.

11. In an AGC amplifier defined in claim 6, wherein said transistor for amplification and said transistor for buffer are formed with bipolar transistors;

and a bias is supplied from a constant voltage source to the base of said transistor for amplification via a resistor, and the base of said transistor for buffer is connected to the collector of said transistor for buffer via a resistor to form a bias circuit for said transistor for amplification and said transistor for buffer.

12. In an AGC amplifier comprising a transistor for amplification and a transistor for buffer, the improvement comprising:

said transistor for amplification and said transistor for buffer each being a field effect transistor, a source of said field effect transistor for amplification, to which an input signal is inputted from a gate thereof being grounded, and a drain of said field effect transistor for amplification being connected via an impedance unit to a source of said field effect transistor for buffer whose drain is connected to a power source to connect said field effect transistor for amplification to said field effect transistor for buffer in series as in direct current;

said drain of said field effect transistor for amplification being directly connected to a gate of said field effect transistor for buffer; and a third field effect transistor;

a source of said third field effect transistor being connected to a gate of said field effect transistor for amplification, a drain of said third field effect transistor being connected to one of the gate of said field effect transistor for buffer and the drain of said field effect transistor for amplification, and a bias control signal being applied to a gate of said third field effect transistor, an output signal being outputted from the source of said field effect transistor for buffer.

13. In an AGC amplifier comprising a transistor for amplification and a transistor for buffer, the improvement comprising:

a source of said transistor for amplification, which receives an input signal from a gate thereof being grounded, and a drain of said transistor for amplification being connected via an impedance unit to a source of said transistor for buffer whose drain is connected to a power source to connect said transistor for amplification to said transistor for buffer in series as in direct current;

said drain of said transistor for amplification being connected to a gate of said transistor for buffer; and a third transistor;

a source of said third transistor being connected to a gate of said transistor for amplification, and a drain of said third transistor being connected to one of the gate of said transistor for buffer and the drain of said transistor for amplification, and a bias control signal being applied to a gate of said third transistor, an output signal being outputted from the source of said transistor for buffer.

14. In an AGC amplifier comprising a transistor for amplification and a transistor for buffer, the improvement comprising:

a source of said transistor for amplification, which receives an input signal from a gate thereof being grounded, and a drain of said transistor for amplification being connected via an impedance unit to a source of said transistor for buffer whose drain is connected to a power source to connect said transistor for amplification to said transistor for buffer in series as in direct current;

said drain of said transistor for amplification being connected to a gate of said transistor for buffer; and a third transistor;

a source of said third transistor being connected to a gate of said transistor for amplification, and a drain of said third transistor being connected to one of the gate of said transistor for buffer and the drain of said transistor for amplification, and a bias control signal being applied to a gate of said third transistor, an output signal being outputted from the source of said transistor for buffer;

wherein said impedance unit connected between the drain of said transistor for amplification and the source of said transistor for buffer is a resistor.

15. In an AGC amplifier comprising a transistor for amplification and a transistor for buffer, the improvement comprising:

a source of said transistor for amplification, which receives an input signal from a gate thereof being grounded, and a drain of said transistor for amplification being connected via an impedance unit to a source of said transistor for buffer whose drain is connected to a power source to connect said transistor for amplification to said transistor for buffer in series as in direct current;

said drain of said transistor for amplification being connected to a gate of said transistor for buffer;

a third transistor;

a source of said third transistor being connected to a gate of said transistor for amplification, and a drain of said third transistor being connected to one of the gate of said transistor for buffer and the drain of said transistor for amplification, and a bias control signal being applied to a gate of said third transistor, an output signal being outputted from the source of said transistor for buffer; and a capacitor connected in series to one of the source and the drain of said third transistor.

\* \* \* \* \*